(12) United States Patent
Lee et al.

(10) Patent No.: US 12,717,247 B2
(45) Date of Patent: Aug. 25, 2026

(54) METHOD OF CORRECTING OVERLAY, METHOD OF CONTROLLING SEMICONDUCTOR PROCESS, AND SEMICONDUCTOR PROCESSING APPARATUS

(71) Applicant: Samsung Electronics Co., Ltd., Suwon-si (KR)

(72) Inventors: Jeongjin Lee, Suwon-si (KR); Inbeom Yim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 18/203,163

(22) Filed: May 30, 2023

(65) Prior Publication Data

US 2024/0118627 A1 Apr. 11, 2024

(30) Foreign Application Priority Data

Oct. 5, 2022 (KR) ........................ 10-2022-0126885

(51) Int. Cl.

| | |
|---|---|
| ***G03F 7/00*** | (2006.01) |
| ***H10P 74/20*** | (2026.01) |
| ***H10P 76/20*** | (2026.01) |
| ***H10P 76/40*** | (2026.01) |

(52) U.S. Cl.

CPC ...... *G03F 7/70633* (2013.01); *G03F 7/70033* (2013.01); *H10P 74/203* (2026.01); *H10P 76/2041* (2026.01); *H10P 76/4085* (2026.01)

(58) Field of Classification Search

CPC .................................... G03F 1/70; G03F 7/20

See application file for complete search history.

(56) References Cited

U.S. PATENT DOCUMENTS

| | | | |
|---|---|---|---|
| 5,877,861 | A | 3/1999 | Ausschnitt et al. |
| 8,587,767 | B2 | 11/2013 | Fiolka et al. |
| 2017/0287752 | A1 | 10/2017 | Godet et al. |
| 2021/0011373 | A1 | 1/2021 | Lee et al. |
| 2022/0100103 | A1 | 3/2022 | Chien et al. |
| 2022/0171295 | A1 | 6/2022 | Meijerink et al. |
| 2022/0179302 | A1 | 6/2022 | Kang et al. |
| 2022/0187786 | A1 | 6/2022 | Hauptmann et al. |

FOREIGN PATENT DOCUMENTS

| | | | |
|---|---|---|---|
| KR | 1020190125550 | A | 11/2019 |
| KR | 1020200049855 | A | 5/2020 |

*Primary Examiner* — Chanceity N Robinson

(74) *Attorney, Agent, or Firm* — Muir Patent Law, PLLC

(57) ABSTRACT

A method of correcting overlay includes forming first patterns in a plurality of first shot areas by radiating extreme ultraviolet light reflected from a first mask to a first layer; forming second patterns in each of a plurality of second shot areas by radiating extreme ultraviolet light reflected from a second mask to a second layer; matching a pair of second shot areas to each of the first shot areas; and generating first and second correction parameters for correcting an overlay error of the second patterns, wherein the first correction parameter is configured to correct an overlay error of each of the second shot areas based on the first shot area matched to each of the second shot areas, and the second correction parameter is configured to correct an overlay error between the pair of second shot areas matched to each of the first shot areas.

20 Claims, 18 Drawing Sheets

L2

| | | |
|---|---|---|
| 211 | 213 | 215 |
| 212 | 214 | 216 |
| 217 | 219 | 221 |
| 218 | 220 | 222 |
| 223 | 225 | 227 |
| 224 | 226 | 228 |

FIG. 3B

METHOD OF CORRECTING OVERLAY, METHOD OF CONTROLLING SEMICONDUCTOR PROCESS, AND SEMICONDUCTOR PROCESSING APPARATUS

CROSS TO REFERENCE TO RELATED APPLICATION(S)

This application claims benefit of priority under 35 U.S.C. § 119 to Korean Patent Application No. 10-2022-0126885, filed on Oct. 5, 2022, in the Korean Intellectual Property Office, the disclosure of which is incorporated herein by reference in its entirety.

BACKGROUND

Example embodiments of the present disclosure relate to a method of correcting overlay, a method of controlling a semiconductor process, and a semiconductor processing apparatus.

A semiconductor process may include a photo process, an etching process, and a deposition process for forming a plurality of layers on a substrate, and a plurality of patterns may be formed on each of the plurality of layers. As a line width of a plurality of patterns and a spacing between a plurality of patterns have been gradually reduced, a photo process using a shorter wavelength, for example, extreme ultraviolet (EUV) light has been suggested, and also a method of using an optical system having a higher numerical aperture for a photo process of a portion of layers to increase resolution of the photo process. A ratio of actually formed patterns and patterns formed on a mask may be different depending on the numerical aperture of an optical system, and accordingly, a method for effectively correcting an overlay error may be necessary.

SUMMARY

An example embodiment of the present disclosure is to provide a method of correcting overlay, a method of controlling a semiconductor process, and a semiconductor processing apparatus which may, by more accurately correcting an overlay error between a plurality of patterns formed by extreme ultraviolet light irradiated through optical systems having different numerical apertures, improve yield of a semiconductor process.

According to an example embodiment of the present disclosure, a method of correcting overlay includes forming a plurality of first patterns in a plurality of first shot areas by radiating extreme ultraviolet light reflected from a first mask to a first layer through a first optical system; forming a plurality of second patterns in each of a plurality of second shot areas by radiating extreme ultraviolet light reflected from a second mask to a second layer above the first layer through a second optical system different from the first optical system; matching a pair of second shot areas among the plurality of second shot areas to each of the plurality of first shot areas; and generating a first correction parameter and a second correction parameter for correcting an overlay error of the plurality of second patterns in each of the plurality of second shot areas, wherein the first correction parameter includes parameters to correct an overlay error of each of the plurality of second shot areas based on the first shot area matched to each of the plurality of second shot areas, and the second correction parameter includes parameters to correct an overlay error between the pair of second shot areas matched to each of the plurality of first shot areas.

According to an example embodiment of the present disclosure, a method of controlling a semiconductor process includes forming a first layer and a second layer sequentially stacked on at least a partial region of a wafer; generating correction parameters for correcting an overlay error of a plurality of second patterns included in the second layer based on the plurality of first patterns included in the first layer; and controlling a photolithography process for forming the plurality of second patterns based on the correction parameters, wherein the plurality of first patterns are formed by a first photolithography process performed on a plurality of first areas included in the first layer, and the plurality of second patterns are formed by a second photolithography process performed on a plurality of second areas included in the second layer, wherein two or more second areas adjacent to each other of the plurality of second shot areas are disposed on each of the plurality of first areas, and wherein the second photolithography process is controlled based on a first correction parameter commonly applied to the two or more second areas and a second correction parameter individually applied to the two or more second areas.

According to an example embodiment of the present disclosure, a semiconductor processing apparatus includes a light source configured to output extreme ultraviolet light; an optical system configured to reflect the extreme ultraviolet light output by the light source from a mask and to allow light to be incident to a wafer on which a first layer and a second layer are sequentially stacked; a control unit configured to control the light source and the optical system; and a measurement unit configured to measure overlay errors of the first layer and the second layer, wherein the first layer includes a plurality of first patterns formed in each of a plurality of first shot areas, and the control unit allows extreme ultraviolet light to be incident to each of a plurality of second shot areas of the second layer and forms a plurality of second patterns, and wherein the measurement unit matches a pair of second shot areas among the plurality of second shot areas to each of the plurality of first shot areas, and generates a first correction parameter for correcting an overlay error of the pair of second shot areas based on each of the plurality of first shot areas, and a second correction parameter for correcting an overlay error between the pair of second shot areas.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A and 3B are diagrams illustrating a semiconductor process according to an example embodiment of the present disclosure;

DETAILED DESCRIPTION

Hereinafter, embodiments of the present disclosure will be described as follows with reference to the accompanying drawings. Like numerals refer to like elements throughout.

It will be understood that, although the terms "first," "second," "third," etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figures 1A, 1B:
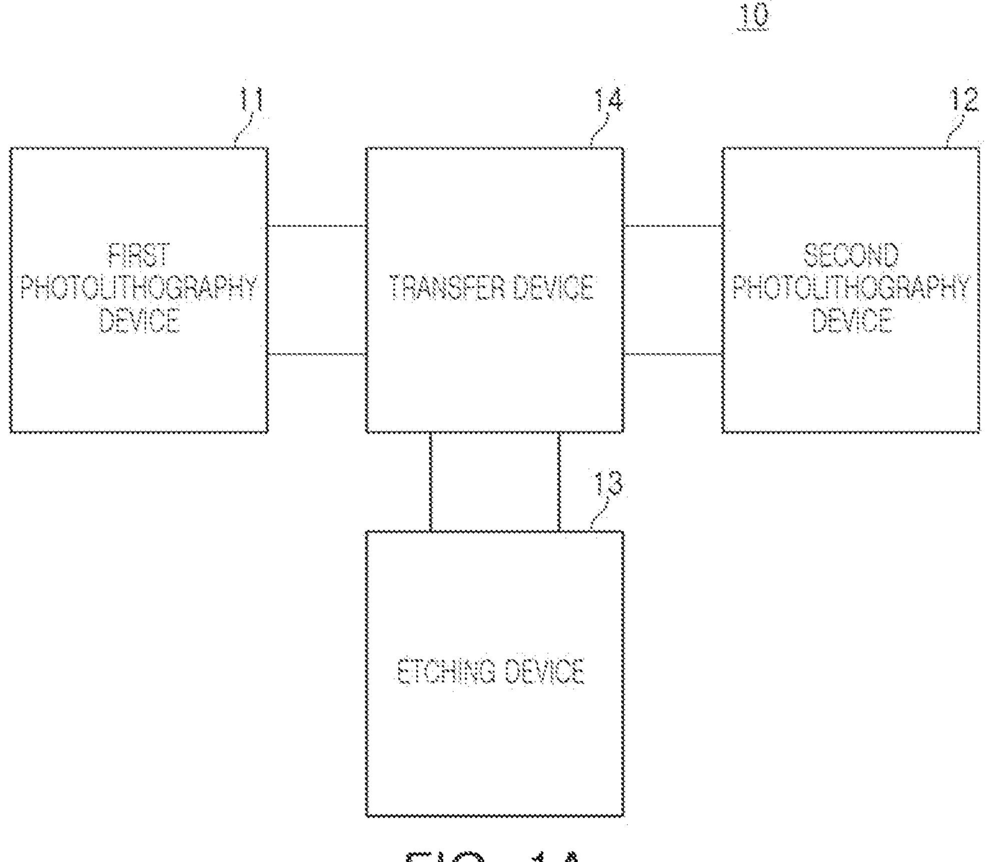
FIG. 1A is a diagram illustrating a process system including a semiconductor process apparatus according to an example embodiment of the present disclosure.
FIG. 1B is a diagram illustrating a semiconductor processing apparatus according to an example embodiment of the present disclosure.

FIG. 1A is a diagram illustrating a process system including a semiconductor process apparatus according to an example embodiment.

Referring to FIG. 1A, a process system 10 in an example embodiment may include a plurality of semiconductor process apparatuses 11-14. The plurality of semiconductor processing apparatuses 11-14 may include a first photolithography device 11, a second photolithography device 12, an etching device 13, and a transfer device 14. However, in example embodiments, the process system 10 may further include devices necessary for performing other processes, such as, for example, a deposition device.

The first photolithography device 11 and the second photolithography device 12 may perform a photolithography process by irradiating light of a predetermined wavelength band to a wafer. For example, each of the first photolithography device 11 and the second photolithography device 12 may include a light source emitting extreme ultraviolet (EUV) light in a wavelength range of 5 nm to 50 nm, and extreme ultraviolet light may be reflected from a mask and may be incident to a wafer. EUV light may be incident directly to the wafer or may be incident to another layer deposited on the wafer.

The etching device 13 may receive the wafer on which the photolithography process has been completed by the first photolithography device 11 and/or the second photolithography device 12 through the transfer device 14, and may perform the etching process. However, in other example embodiments, the wafer may be transferred to a device other than the etching device 13 depending on the semiconductor process supported by the process system 10 and the semiconductor device to be manufactured and produced by the process system 10. The transfer device 14 may include a transfer robot for transferring a wafer between the first photolithography device 11 and the second photolithography device 12 and the etching device 13.

A photo process having different characteristics may be performed in the first photolithography device 11 and the second photolithography device 12. A first optical system disposed on a path on which EUV light is incident to a wafer in the first photolithography device 11 may have different characteristics from those of the second optical system disposed on a path on which extreme ultraviolet light is incident on a wafer in the second photolithography device 12.

For example, the first optical system may have a first numerical aperture, and the second optical system may have a second numerical aperture larger than the first numerical aperture. The first numerical aperture may be 0.33 or less, and the second numerical aperture may be 0.5 or more. When the second optical system is larger than the first optical system, the resolution of the second photolithography device 12 may be higher than that of the first photolithography device 11.

When the first optical system of the first photolithography device 11 and the second optical system of the second photolithography device 12 have different numerical apertures as described above, the area of the first shot area irradiated with extreme ultraviolet light by exposure by the first photolithography device 11 may be different from an area of a second shot area irradiated with extreme ultraviolet light by exposure by the second photolithography device 12. For example, when the numerical aperture of the first optical system is smaller than that of the second optical system, the area of the first shot area may be larger than the area of the second shot area. Accordingly, a method for correcting an overlay error between a plurality of first patterns formed in the first shot area and a plurality of second patterns formed in the second shot area may be necessary.

In an example embodiment, two or more second shot areas may be matched to one first shot area, and a first correction parameter for correcting an overlay error of two or more second shot areas matched to the first shot area based on the first shot area may be generated. Also, a second correction parameter for correcting an overlay error of each of the two or more second shot areas may be generated. By correcting the overlay error of each of the second shot areas based on the first correction parameter and the second correction parameter, despite the difference between the first photolithography device 11 and the second photolithography device 12, an overlay error between the first shot area and the second shot area may be effectively reduced.

FIG. 1B is a diagram illustrating a semiconductor processing apparatus according to an example embodiment.

Referring to FIG. 1B, a semiconductor processing apparatus 100 in an example embodiment may be a device for performing a photolithography process, and may include a light source 110, a first sub-optical system 120, a second sub-optical system 130, a mask stage 140, a wafer stage 150, a control unit 160, and a measurement unit 170. The semiconductor processing apparatus 100 may be an example of the first photolithography device 11 and/or the second photolithography device 12.

The light source 110 may generate and emit EUV light having a high energy density within a wavelength range of several nanometers to several tens of nanometers. In example embodiments, the light source 110 may generate and output EUV light having a high energy density in a 13.5 nm wavelength band. The light source 110 may include a plasma-based light source or a synchrotron radiation light source. A plasma-based light source may refer to a light source for generating plasma and using light emitted by the plasma, and may include a laser-produced plasma (LPP) light source or a discharge-produced plasma (DPP) light source. For example, when the light source 110 includes a plasma-based light source, a condensing mirror such as an elliptical mirror or a spherical mirror for increasing the energy density of extreme ultraviolet light incident to the first sub-optical system 120 may be further included in the light source 110.

The first sub-optical system 120 may include a plurality of mirrors. In the semiconductor processing apparatus 100 according to an example embodiment, the first sub-optical system 120 may include two or three mirrors. However, the number of mirrors included in the first sub-optical system 120 is not necessarily limited to two or three. The first sub-optical system 120 may transfer extreme ultraviolet light emitted from the light source 110 to the mask 145. Extreme ultraviolet light emitted from the light source 110 may be reflected by mirrors included in the first sub-optical system 120 and may be incident to the mask 145 seated on the mask stage 140. In an example embodiment, the first sub-optical system 120 may generate extreme ultraviolet light in the form of a curved slit and may allow the light to be incident to the mask 145.

The mask 145 may be a reflective mask including a reflective area along with a non-reflective area and/or an intermediate reflective area. The mask 145 may include a reflective multilayer film for reflecting extreme ultraviolet light on a substrate formed of a low thermal expansion coefficient material (LTEM) such as quartz, and an absorption layer pattern formed on the reflective multilayer film. The reflective multilayer film may have a structure in which a molybdenum film (Mo layer) and a silicon film (Si layer) are alternately stacked. Meanwhile, the absorption layer may be formed of TaN, TaNO, TaBO, Ni, Au, Ag, C, Te, Pt, Pd, Cr, or the like. However, the material of the reflective multilayer film and the material of the absorption layer are not limited to the above-mentioned materials, and the absorption layer portion may correspond to the non-reflection area and/or the intermediate reflection area described above.

The mask 145 may reflect extreme ultraviolet light incident through the first sub-optical system 120 and may allow the light to be incident to the second sub-optical system 130. For example, EUV light passing through the first sub-optical system 120 may be structured according to a pattern including a reflective multilayer film and an absorption layer on a substrate, and may be incident to the second sub-optical system 130. The EUV light may be structured to include secondary diffracted light based on the pattern on the mask 145. The structured EUV light may be incident to the second sub-optical system 130 while retaining the information in a pattern form included in the mask 145, and the light may be projected onto the wafer W through the second sub-optical system 130 such that an image corresponding to the pattern shape included in the mask 145 may be formed.

The second sub-optical system 130 may include a plurality of mirrors. In the example embodiment illustrated in FIG. 1B, the second sub-optical system 130 may include the first mirror 131 and the second mirror 132, but an example embodiment thereof is not limited thereto, and the second sub-optical system 130 may include three or more mirrors. For example, in the semiconductor processing apparatus 100, the second sub-optical system 130 may include four to eight mirrors.

The second sub-optical system 130 may be controlled such that extreme ultraviolet light reflected from the mask 145 may be incident to the upper surface of the wafer W with a predetermined inclination. For example, the second sub-optical system 130 may adjust a travelling path of extreme ultraviolet light such that extreme ultraviolet light may be incident to the upper surface of the wafer W at an angle of about 6 degrees.

The mask 145 may be seated on the mask stage 140, and the wafer W may be seated on the wafer stage 150. For example, the mask stage 140 and the wafer stage 150 may be controlled by the control unit 160. In an initial state in which the mask 145 and the wafer W are seated on the mask stage 140 and the wafer stage 150, respectively, when the upper surfaces of the mask 145 and the wafer W are defined as an X-Y plane, each of the mask stage 140 and the wafer stage 150 may be moved by the control unit 160. In an example embodiment, the control unit 160 may rotate each of the mask stage 140 and the wafer stage 150 on the X-Y plane with respect to the Z-axis, or on the Y-Z plane or the X-Z plane with respect to one axis of the X-Y plane. By the movement of the mask stage 140 and/or the wafer stage 150 as described above, the mask 145 and/or the wafer W may move or rotate along at least one of the X-axis, Y-axis, and Z-axis.

Although not illustrated, the control unit 160 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the control unit 160, and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the control unit 160 can include antennas, network interfaces that provide wireless and/or wire line digital and/or analog interface to one or more networks over one or more network connections (not shown), a power source that provides an appropriate alternating current (AC) or direct current (DC) to power one or more components of the control unit 160, and a bus that allows communication among the various disclosed components of the control unit 160. The control unit 160 may cause one or more other elements to rotate each of the mask stage 140 and the wafer stage 150 on the X-Y plane with respect to the Z-axis, or on the Y-Z plane or the X-Z plane with respect to one axis of the X-Y plane. The one or more other elements may include, for example, one or more actuators (e.g., a hydraulic actuator, a magnetic actuator, a mechanical actuator, or the like) that cause the mask stage and/or the wafer stage 150 to move in the prescribed manner.

The measurement unit 170 may measure a critical dimension (CD) and/or an overlay error of a plurality of patterns formed on the wafer W. For example, the measurement unit 170 may include an electron microscope or an optical microscope such as a scanning electron microscope (SEM) or a transmission electron microscope (TEM). Also, the measurement unit 170 may measure a critical dimension or an overlay error using an image ellipsoidal polarization method or a spectroscopic image ellipsoidal polarization method. In example embodiments, the measurement unit 170 may be provided as a separate device, separated from the semiconductor processing apparatus 100.

For example, when a first layer and a second layer are sequentially stacked on a wafer W, the measurement unit 170 may measure an overlay error of a plurality of first patterns included in the first layer and a plurality of second patterns included in the second layer. As the control unit 160 moves the mask stage 140 and/or the wafer stage 150 based on the overlay error measured by the measurement unit 170, the overlay error may be reduced.

In an example embodiment, the first layer may be already formed on the wafer W put into the semiconductor processing apparatus 100, and the semiconductor processing apparatus 100 may perform a photolithography process on the second layer on the first layer using the mask 145 and EUV light. In this case, the photolithography process preceding the formation of the first layer may be performed in a process apparatus having characteristics different from those of the semiconductor process apparatus 100.

For example, the photolithography process performed in advance to form the first layer may be performed in a process apparatus for allowing extreme ultraviolet light to be incident to the wafer W through an optical system of a first numerical aperture. In the semiconductor processing apparatus 100 in which a photolithography process is performed on the second layer, an optical system through which extreme ultraviolet light passes may have a second numerical aperture larger than the first numerical aperture. Accordingly, a shot area in the photolithography process performed prior to forming the first layer may have an area different from that of a shot area in the photolithography process performed by the semiconductor processing apparatus 100, which will be described in greater detail with reference to FIGS. 2A and 2B.

Figure 2A:
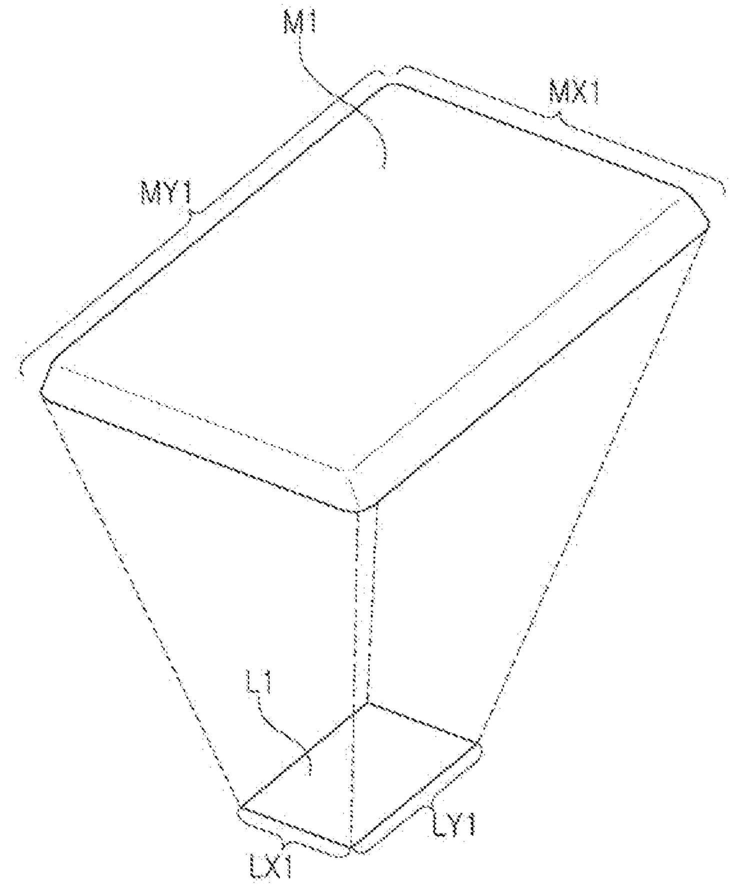
FIGS. 2A and 2B are diagrams illustrating a method for controlling a semiconductor process according to an example embodiment of the present disclosure.
Figure 2B:
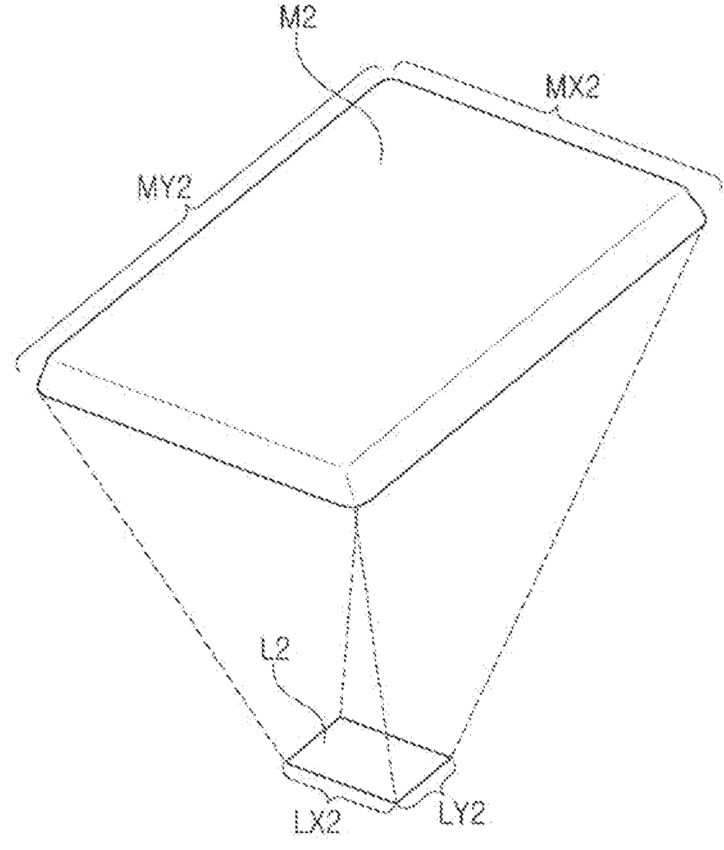

FIGS. 2A and 2B are diagrams illustrating a method for controlling a semiconductor process according to an example embodiment.

FIG. 2A may be a diagram illustrating an area ratio between a mask and a shot area when extreme ultraviolet light passing through a first optical system having a first numerical aperture is irradiated to a wafer. Meanwhile, FIG. 2B may be a diagram illustrating an area ratio between a mask and a shot area when extreme ultraviolet light passing through a second optical system having a second numerical aperture larger than the first numerical aperture is irradiated to a wafer.

Referring to FIG. 2A, extreme ultraviolet light may be irradiated to a partial area of a first mask M1 having a first mask width MX1 in the X-axis direction and a first mask length MY1 in the Y-axis direction and may be reflected. Extreme ultraviolet light may pass through a first optical system having a first numerical aperture and may be irradiated to the wafer. For example, extreme ultraviolet light may be irradiated to a first layer L1 on the wafer, and a plurality of first patterns may be formed on the first layer L1 by the extreme ultraviolet light reflected from the first mask M1.

As illustrated in FIG. 2A, the first shot area into which the extreme ultraviolet light reflected from the first mask M1 is incident may have a first width LX1 in the X-axis direction and may have a first length LY1 in the Y-axis direction. The first width LX1 may be smaller than the first mask width MX1, and the first length LY1 may be smaller than the first mask length MY1. For example, both the ratio between the first width LX1 and the first mask width MX1 and the ratio between the first length LY1 and the first mask length MY1 may be 1:4.

Thereafter, referring to FIG. 2B, extreme ultraviolet light may be irradiated to a partial area of the second mask M2 having a second mask width MX2 in the X-axis direction and a second mask length MY2 in the Y-axis direction and may be reflected. Extreme ultraviolet light may be irradiated to the wafer W by passing through a second optical system having a second numerical aperture. For example, extreme ultraviolet light may be irradiated to the second layer L2 on the wafer, and a plurality of second patterns may be formed on the second layer L2 by the extreme ultraviolet light reflected from the second mask M1. The second layer may be stacked on the first layer L1.

As illustrated in FIG. 2B, the second shot area into which the extreme ultraviolet light reflected from the second mask M2 is incident may have a second width LX2 in the X-axis direction and a second length LY2 in the Y-axis direction. The second width LX2 may be smaller than the second mask width MX2, and the second length LY2 may be smaller than the second mask length MY2. However, in the example embodiment illustrated in FIG. 2B, the ratio between the second width LX2 and the second mask width MX2 may be different from the ratio between the second length LY2 and the second mask length MY2. For example, the ratio between the second width LX2 and the second mask width MX2 may be 1:4, whereas the ratio between the second length LY2 and the second mask length MY2 may be 1:8.

Figure 3A:
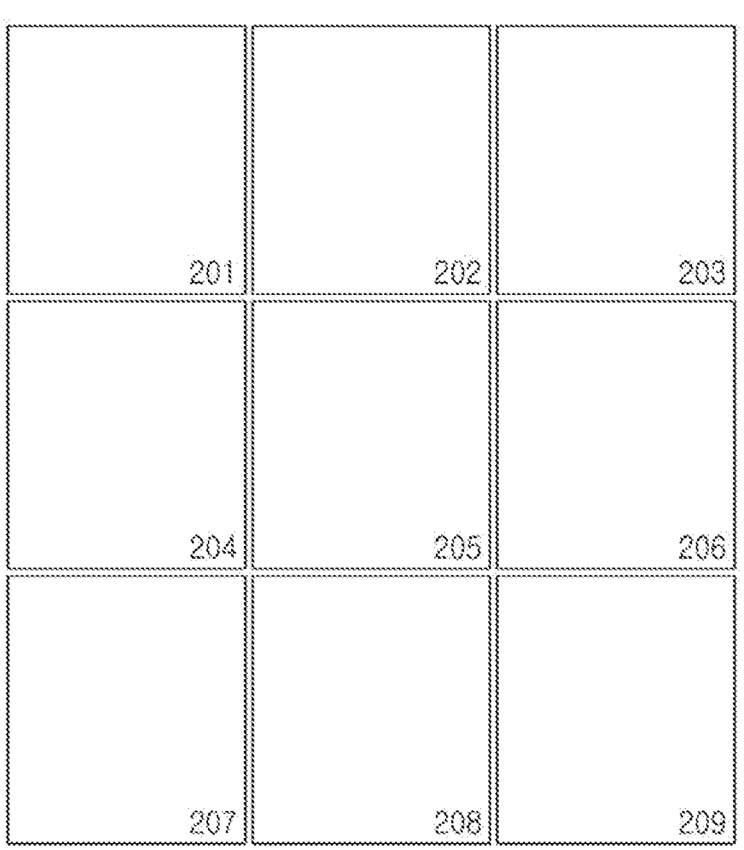

FIGS. 3A and 3B are diagrams illustrating a semiconductor process according to an example embodiment.

FIG. 3A may be a diagram illustrating a plurality of first shot areas 201-209 in which extreme ultraviolet light is irradiated to a first layer L1 of a wafer (e.g., wafer W) by a semiconductor processing apparatus according to an example embodiment. FIG. 3B may be a diagram illustrating a plurality of second shot areas 211-228 in which extreme ultraviolet light is irradiated to the second layer L2 of the wafer (e.g., wafer W) by the semiconductor processing apparatus according to an example embodiment.

Referring to FIGS. 3A and 3B, the number of first shot areas 201-209 included in the same area of each of the first and second layers L1 and L2 and the number of the plurality of second shot areas 211-228 may be different. This is because the numerical aperture of the optical system through which the extreme ultraviolet light irradiated to the plurality of first shot areas 201-209 passes may be different from the numerical aperture of the optical system through which extreme ultraviolet light irradiated to the plurality of second shot areas 211-228 passes. When extreme ultraviolet light irradiated to the plurality of first shot areas 201 to 209 passes through an optical system of a first numerical aperture, and extreme ultraviolet light irradiated to the plurality of second shot areas 211-228 passes through a second numerical aperture larger than the first numerical aperture, as illustrated in FIGS. 3A and 3B, the same area of each of the first and second layers L1 and L2 may be covered with different numbers of shot areas.

As described above, due to the difference in the numerical aperture of the optical system through which extreme ultraviolet light passes, eighteen exposure processes may be necessary in the second layer L2 for an area of a size which may be covered by nine exposure processes in the first layer L1. Also, since the plurality of first shot areas 201-209 and the plurality of second shot areas 211-228 have different sizes, a method for correcting an overlay error may also need to be applied differently from a general method. The number of first shot areas 201-209 and the number of second shot areas 211-228 illustrated in FIGS. 3A and 3B is merely an example and may vary in example embodiments. For example, more than 18 exposure processes may be necessary in the second layer L2 for an area of a size which may be covered by nine exposure processes in the first layer L1.

In an example embodiment, two or more of the plurality of second shot areas 211-228 may be matched to each of the plurality of first shot areas 201-209 to correct an overlay error. For example, assuming that the second layer L2 is disposed on the first layer L1, the first second shot area 211 and the second second shot area 212 may be matched to the first first shot area 201. However, depending on the difference between the first numerical aperture and the second numerical aperture, three or more of the second shot areas 211-228 may be matched to the first first shot area 201.

When the plurality of first shot areas 201-209 and the plurality of second shot areas 211-228 are matched to each other, based on each of the plurality of first shot areas 201-209, a first correction parameter to be applied to the second shot areas 211-228 matched thereto may be generated. Since the first correction parameter is generated based on each of the plurality of first shot areas 201-209, for example, the first correction parameter generated based on the first shot area 201 may be commonly applied to the first second shot area 211 and the second second shot area 212.

Thereafter, a second correction parameter to be applied to each of the plurality of second shot areas 211-228 may be generated. The second correction parameter may be for correcting an overlay error according to a deviation of the plurality of second shot areas 211-228 and may be generated independently of the plurality of first shot areas 201-209.

In an example, the overlay error may have a greater correction by the first correction parameter than by the second correction parameter. This is because the overlay error of the plurality of first patterns included in the plurality of first shot areas 201-209 may also occur by the photolithography process for forming the first layer L1, an etching process, and a deposition process performed after the photolithography process. Accordingly, a coordinate difference between a plurality of overlay keys formed in each of the plurality of first shot areas 201-209 may be greater than a coordinate difference between a plurality of overlay keys formed in each of a plurality of second shot areas 211-228.

Figure 4:
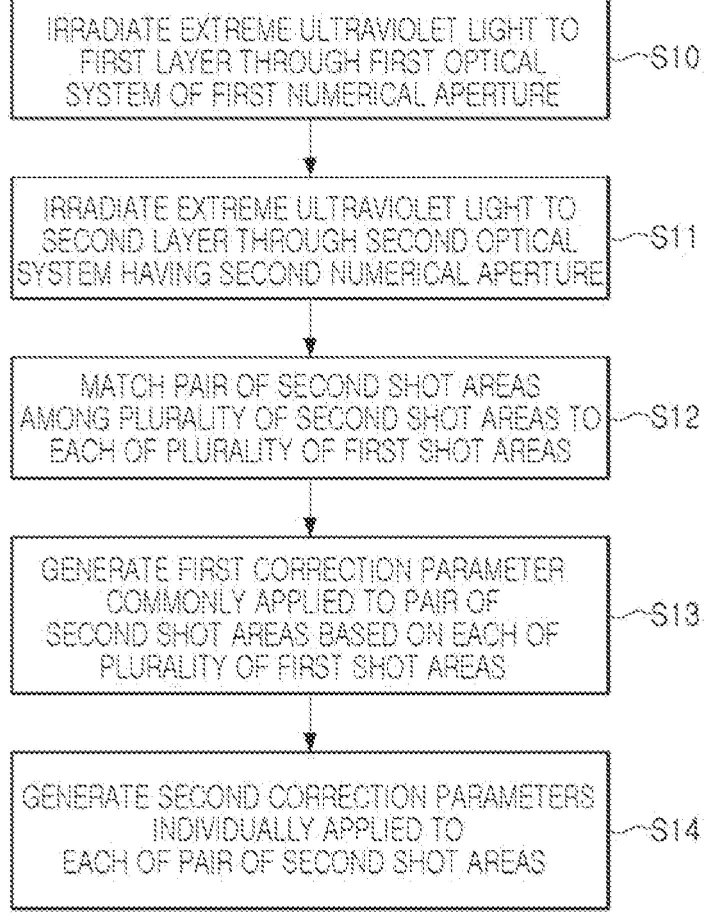
FIG. 4 is a flowchart illustrating a method of correcting overlay according to an example embodiment of the present disclosure.

FIG. 4 is a flowchart illustrating a method of correcting overlay according to an example embodiment.

Referring to FIG. 4, the method of correcting overlay in an example embodiment may start with irradiating extreme ultraviolet (EUV) light to a first layer (e.g., first layer L1) through a first optical system of a first numerical aperture (S10). The first layer may be defined from the upper surface of the wafer (e.g., wafer W) or may be defined above the upper surface of the wafer. The process S10 may include a first optical system of a first numerical aperture (e.g., the first optical system of the first photolithography device 11) and a light source (e.g., light source 110) for emitting extreme ultraviolet light, and may be performed in a first semiconductor processing apparatus for performing a first photolithography process.

When the first photolithography process for the first layer is completed, the wafer may be transferred to another process apparatus for performing an etching process, a deposition process, and the like. Thereafter, the wafer (e.g., wafer W) may be transferred to a second semiconductor processing apparatus in which a second photolithography process is performed. In the second photolithography process, extreme ultraviolet light may be irradiated to the second layer (e.g., second layer L2) through a second optical system having a second numerical aperture (e.g., the second optical system of the second photolithography device 12) (S11). For example, the second numerical aperture may be larger than the first numerical aperture, and the first semiconductor processing apparatus and the second semiconductor processing apparatus may be provided as separate devices. For example, each of the first and second semiconductor processing apparatuses may be implemented as a semiconductor processing apparatus 100.

When EUV light is irradiated to the second layer, correction parameters for correcting an overlay error may be generated. For example, correction parameters may be generated based on an overlay error measured by a measurement unit mounted on the second semiconductor processing apparatus or a measuring device connected to the second semiconductor processing apparatus. The measurement unit 170 may be an example of the measurement unit or the measuring device.

However, as described above with reference to FIGS. 3A and 3B, due to the difference between the first numerical aperture and the second numerical aperture, the area of the first shot area to which extreme ultraviolet light is irradiated at once in the first photolithography process may be larger than the area of the second shot area to which extreme ultraviolet light is irradiated at once in the second photolithography process. Accordingly, prior to executing overlay correction, a plurality of first shot areas and a plurality of second shot areas may be matched.

In an example embodiment, a pair of second shot areas among a plurality of second shot areas may be matched to each of a plurality of first shot areas (S12). The plurality of first shot areas 201-209 may be an example of the plurality of first shot areas, and the plurality of second shot areas 211-228 may be an example of the plurality of second shot areas. A pair of second shot areas matching one first shot area may be arranged in one direction parallel to the upper surface of the wafer, and for example, the one direction may be the Y-axis direction with reference to FIGS. 2A and 2B. This is because, as illustrated in FIG. 2A, the first shot area may have a ratio of 1:4 with the mask in each of the X-axis direction and the Y-axis direction, and the second shot area may have a ratio of 1:4 with the mask in the X-axis direction and a ratio of 1:8 in the Y-axis direction, as illustrated in FIG. 2B. However, in example embodiments, three or more second shot areas may be matched to each of a plurality of first shot areas.

When a pair of second shot areas are matched to each of a plurality of first shot areas, a first correction parameter commonly applied to the pair of second shot areas based on each of the plurality of first shot areas may be generated (S13). For example, referring to FIGS. 3A and 3B, based on the first shot area 201, a first correction parameter commonly applied to a pair of second shot areas 211 and 212 may be matched to the first first shot area 201.

When the first correction parameters are generated, second correction parameters individually applied to each of the pair of second shot areas may be generated (S14). As an example, referring to FIGS. 3A and 3B, the second correction parameters applied to each of the first second shot area 211 and the second correction parameter applied to each of the second second shot areas 212 may have values. The second semiconductor processing apparatus may correct an overlay error in the second photolithography process of forming each of a plurality of second shot areas by irradiating extreme ultraviolet light to the second layer based on the first correction parameter and the second correction parameter.

After the method of correcting overlay is performed, additional steps may be performed on the wafer, for example to form a semiconductor device. For example, additional layers may be deposited on the wafer to form semiconductor chips, the semiconductor chips may then be singulated, packaged on a package substrate, and encapsulated by an encapsulant to form a semiconductor device. The above steps may be controlled by a control system including one or more computers and one or more electro-mechanical devices for moving a travelling part within a transferring apparatus.

Figure 5A:
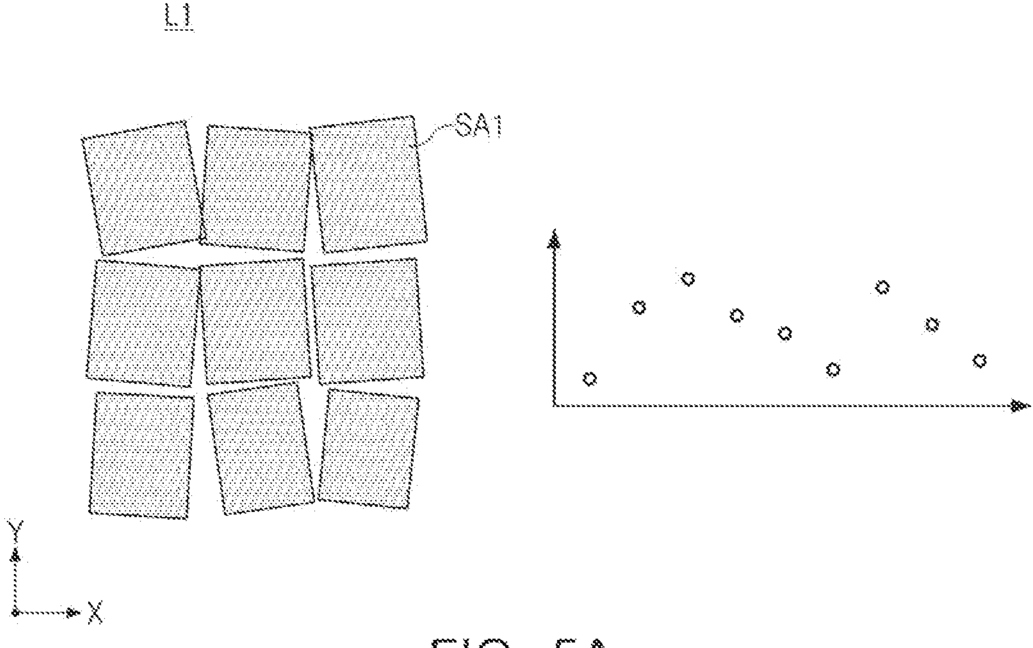
FIGS. 5A and 5B are diagrams illustrating a method of correcting overlay according to an example embodiment of the present disclosure.
Figure 5B:
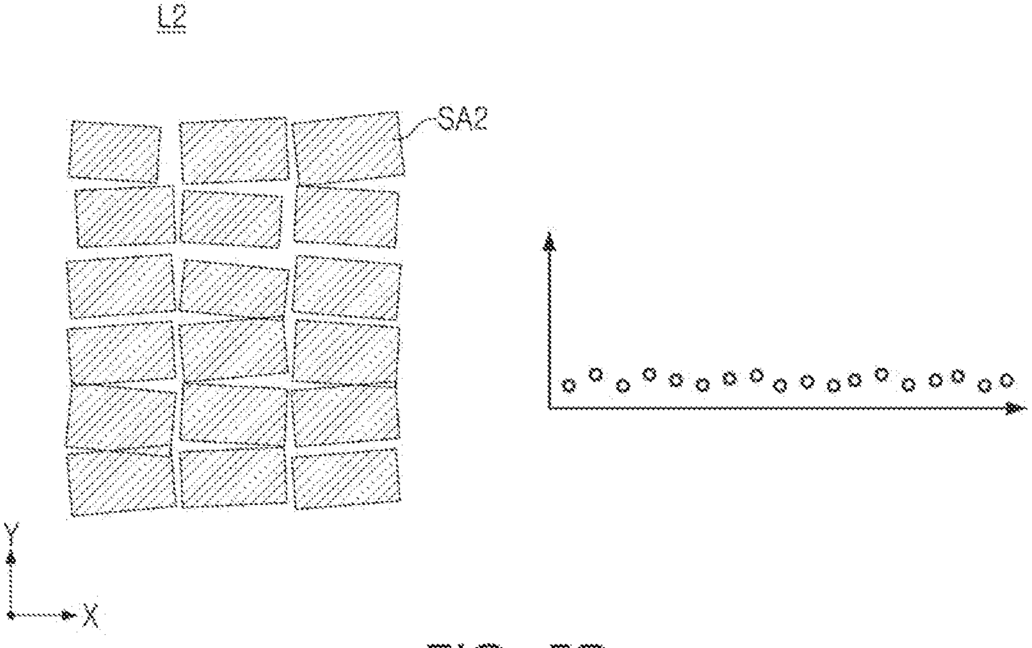

FIGS. 5A and 5B are diagrams illustrating a method of correcting overlay according to an example embodiment.

FIG. 5A illustrates a plurality of first shot areas SA1 formed by extreme ultraviolet light irradiated to a first layer L1 through a first optical system of a first numerical aperture (e.g., first optical system of the first photolithography device 11), and a coordinate deviation of the first overlay keys disposed in the plurality of first shot areas SA1. Meanwhile, FIG. 5B illustrates a plurality of second shot areas SA2 formed by extreme ultraviolet light irradiated to the second layer L2 through a second optical system of a second numerical aperture greater than the first numerical aperture (e.g., second optical system of the second photolithography device 12), and a coordinate deviation of the second overlay keys disposed in the plurality of second shot areas SA2.

As illustrated in FIGS. 5A and 5B, the coordinate deviation of the first overlay keys disposed in the plurality of first shot areas SA1 may be greater than a coordinate deviation of the second overlay keys disposed in the plurality of second shot areas SA2. This is because the coordinate deviation of the second overlay keys may be affected only by the second photolithography process for forming the plurality of second shot areas SA2, whereas the coordinate deviation of the first overlay keys may be affected by the first photolithography process and an etching process and a deposition process subsequently performed.

Accordingly, a first correction parameter commonly applied to a pair of second shot areas SA2 matched to each of a plurality of first shot areas SA1 may have more influence on the second photolithography process than the second correction parameter applied to each of the pair of second shot areas SA2. For example, a displacement of moving the wafer stage (e.g., wafer stage 150) and/or the mask stage (e.g., mask stage 140) in the second photolithography process with reference to the first correction parameter may be greater than a displacement of moving the wafer stage and/or the mask stage with reference to the second correction parameter.

FIGS. 6 to 9 are diagrams illustrating a method of correcting overlay according to an example embodiment. In FIGS. 6 to 9, wafer 300 may correspond to wafer W of FIG. 1B.

Figure 6:
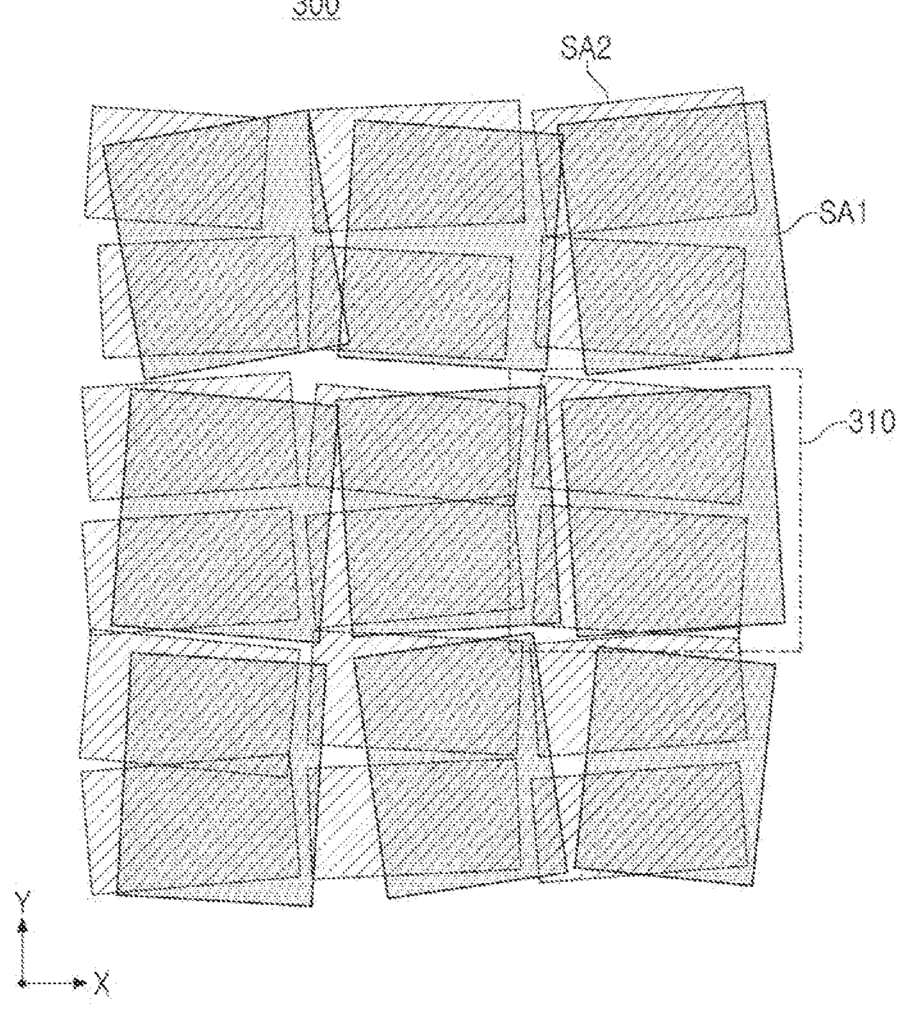
FIGS. 6 to 9 are diagrams illustrating a method of correcting overlay according to an example embodiment of the present disclosure.

Referring to FIG. 6, a first layer and a second layer may be sequentially formed on a wafer 300 put into a semiconductor process. The first layer may include a plurality of first shot areas SA1, and the second layer may include a plurality of second shot areas SA2. Each of the plurality of first shot areas SA1 may be a region to which extreme ultraviolet light is incident by an exposure in the first semiconductor processing apparatus performing the first photolithography process (e.g., the first optical system of the first photolithography device 11), and each of the plurality of second shot areas SA2 may be a region to which extreme ultraviolet light is incident by an exposure in a second semiconductor processing apparatus performing a second photolithography process (e.g., the second optical system of the second photolithography device 12). As described above, the first optical system of the first semiconductor processing apparatus and the second optical system of the second semiconductor processing apparatus may have different numerical apertures, and accordingly, an area of each of the plurality of second shot areas SA2 may be smaller than an area of each of the plurality of first shot areas SAT.

When a first layer is formed by a first photolithography process and a subsequent process thereafter, and the plurality of second shot areas SA2 are formed on a second layer formed on the first layer, correction parameters needed to correct the overlay error can be generated. To generate correction parameters, a plurality of first shot areas SA1 and a plurality of second shot areas SA2 may be matched. For example, a pair of second shot areas SA2 adjacent to each other in the first direction (Y-axis direction) may be matched to each of the plurality of first shot areas SA1. However, due to process deviation, as illustrated in FIG. 6, each of the plurality of first shot areas SA1 and a pair of second shot areas SA2 matched thereto may not be accurately aligned.

A measurement unit of a second semiconductor processing apparatus performing a second photolithography process or a measurement device interlocked with the second semiconductor processing apparatus may measure an overlay error occurring in the second photolithography process. The control unit of the second semiconductor processing apparatus may reduce the overlay error by adjusting the position of the mask stage (e.g., mask stage 140) on which the mask is seated and/or the wafer stage (e.g., wafer stage 150) on which the wafer is seated during the second photolithography process based on the measured overlay error. Hereinafter, a method of generating correction parameters for correcting an overlay error will be described with reference to FIGS. 7 to 9.

Figure 7:
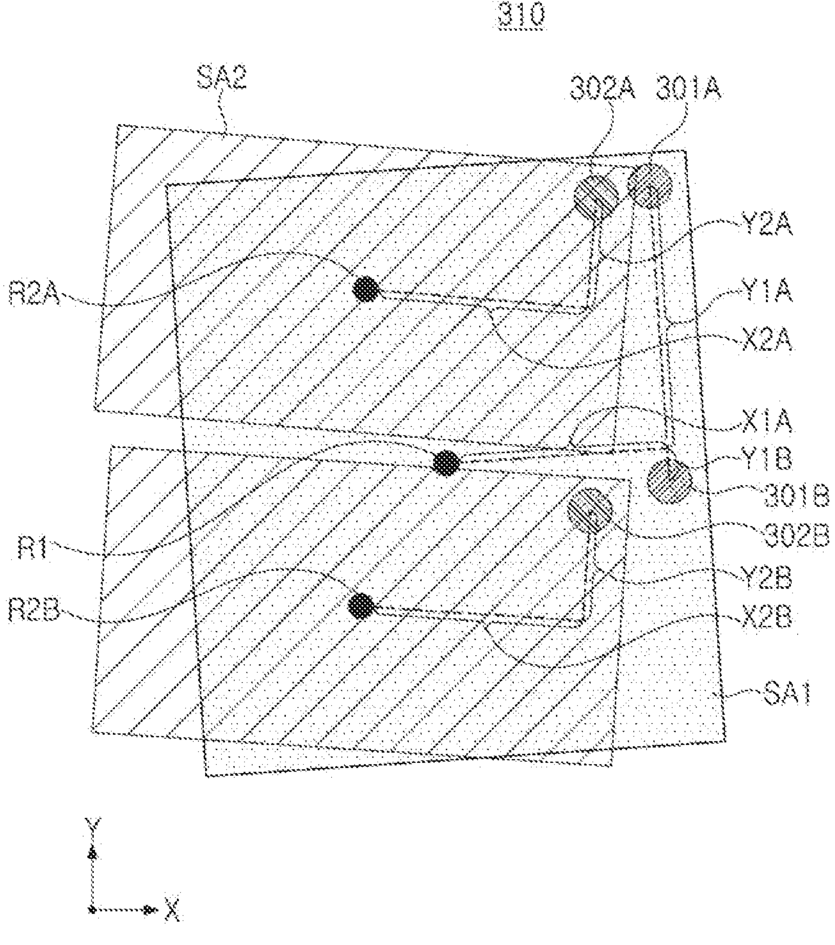

FIG. 7 may be enlarged diagrams illustrating the first area 310 in the wafer 300 according to the example embodiment illustrated in FIG. 6. Referring to FIG. 7, the first shot area SA1 and the pair of second shot areas SA2 may not be accurately aligned due to an overlay error. Accordingly, the first overlay keys 301A and 301B disposed in the first shot area SA1 may not overlap the second overlay keys 302A and 302B disposed in the second shot area SA2 and may be disposed in different positions.

For example, the position of each of the first overlay keys 301A and 301B may have a coordinate value represented in a first coordinate system defined based on the first reference point RI, which is the center of the first shot area SA1. Meanwhile, the position of each of the second overlay keys 302A and 302B may have a coordinate value represented in a second coordinate system defined based on the center, second reference points R2A and R2B, of each of the second shot areas SA2.

As described above with reference to FIG. 4, the correction parameters for correcting the overlay error in an example embodiment may include a first correction parameter commonly applied to the pair of second shot areas SA2 matched to the first shot area SA1 and a second correction parameter individually applied to each of the pair of second shot areas SA2. The first correction parameter may correct an overlay error to match the second overlay keys 302A, 302B included in the pair of second shot areas SA2 with respect to the first overlay keys 301A and 301B included in the first shot area SA1.

Figure 8:
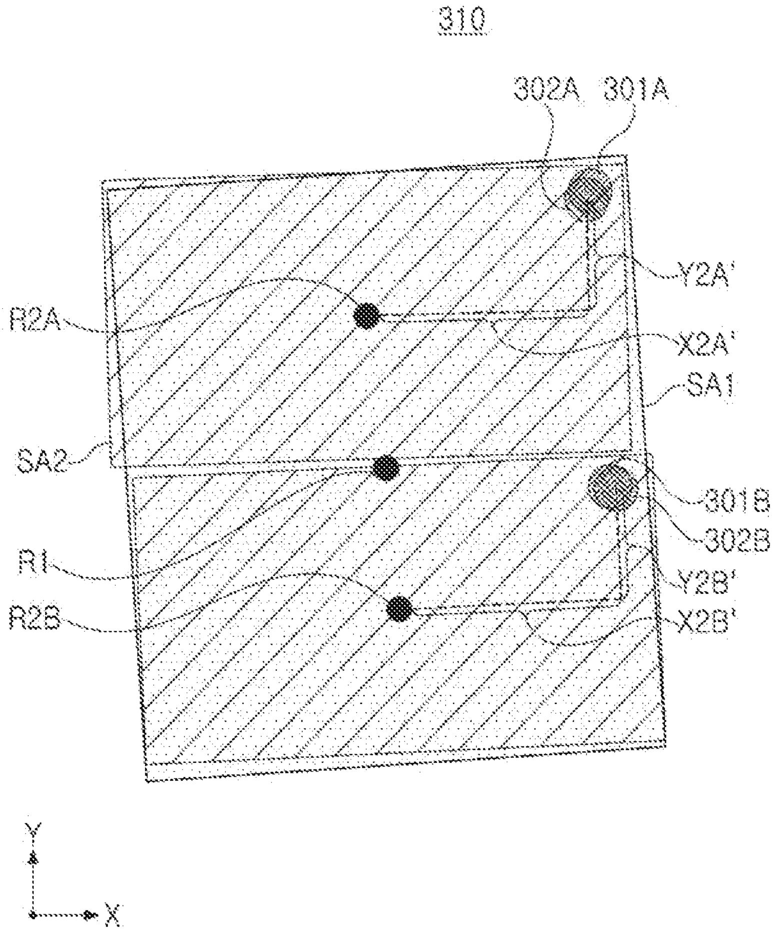

Since the area of the first shot area SA1 is larger than the area of each of the pair of second shot areas SA2, a first coordinate system defining coordinates of the first overlay keys 301A and 301B in the first shot area SA1 may be different from a second coordinate system defining coordinates of the second overlay keys 302A and 302B in each of the second shot areas SA2. In an example embodiment, the second coordinate values ([X2A, Y2A], [X2B, Y2B]) of the second overlay keys 302A and 302B represented in the second coordinate system may be converted into correction coordinate values corresponding to the first coordinate system ([X2A', Y2A'], [X2B', Y2B']). As illustrated in FIG. 8, first correction parameter may be generated such that a difference between correction coordinate values ([X2A', Y2A'], [X2B', Y2B']) representing the positions of the second overlay keys 302A and 302B in the first coordinate system, and coordinate values ([X1A, Y1A], [X1A, Y1B]) of the first overlay keys 301A and 301B may be reduced.

Figure 9:
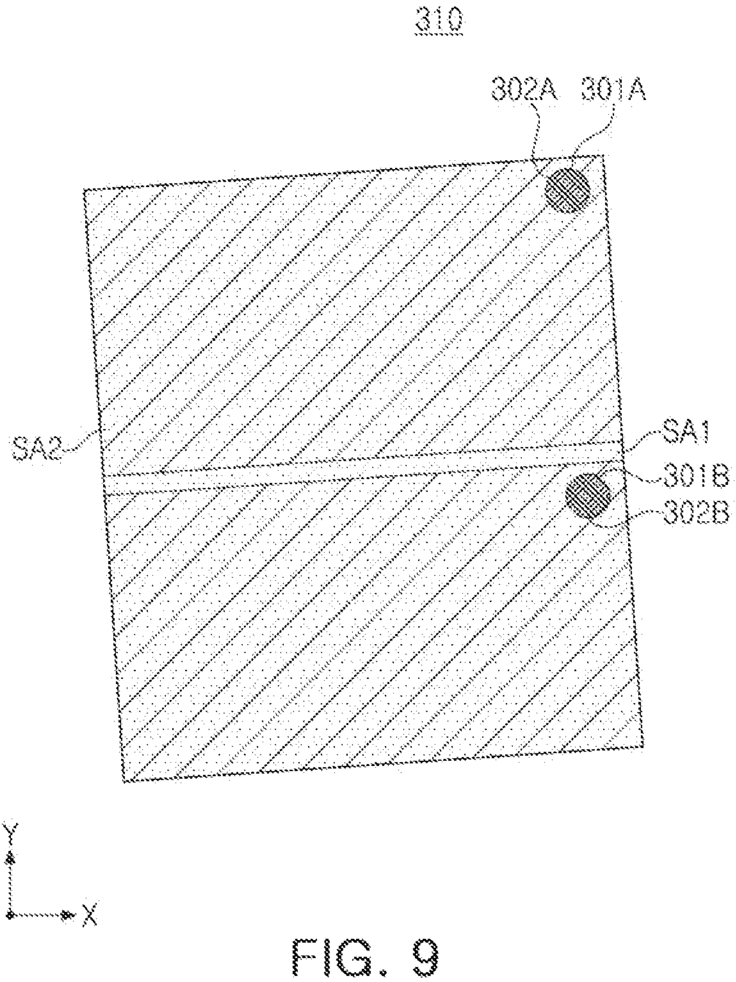

Referring to FIG. 9, in an example embodiment, after generating a first correction parameter commonly applied to the pair of second shot areas SA2, a second correction parameter individually applied to each of the pair of second shot areas SA2 may be generated. For example, after correcting the overlay error of each of the pair of second shot areas SA2 using the first correction parameter, residual error data corresponding to coordinate deviations between the first overlay keys 301A and 301B and the second overlay keys 302A and 302B may be calculated. The residual error data may be data representing a coordinate deviation between the first overlay keys 301A and 301B and the second overlay keys 302A and 302B in the first coordinate system.

In an example embodiment, residual error data may be converted into coordinate values represented in a second coordinate system corresponding to each of the second shot areas SA2, and a second correction parameter may be generated. The second correction parameter may remove the coordinate deviation between the second overlay keys 302A and 302B included in each of the second shot areas SA2 matched to the same first shot area SA1 and may reduce residual error data.

The control unit of the second semiconductor processing apparatus may reduce an overlay error in the second photolithography process using a correction parameter obtained by merging the first correction parameter and the second correction parameter. For example, a correction parameter obtained by merging the first correction parameter and the second correction parameter may be applied to control movement of a mask stage and/or a wafer stage included in the second semiconductor processing apparatus. In example embodiments, the position of the mask stage and/or the wafer stage may be adjusted by first applying the first correction parameter, and the position of the mask stage and/or the wafer stage may be finely adjusted using the second correction parameter.

Figure 10:
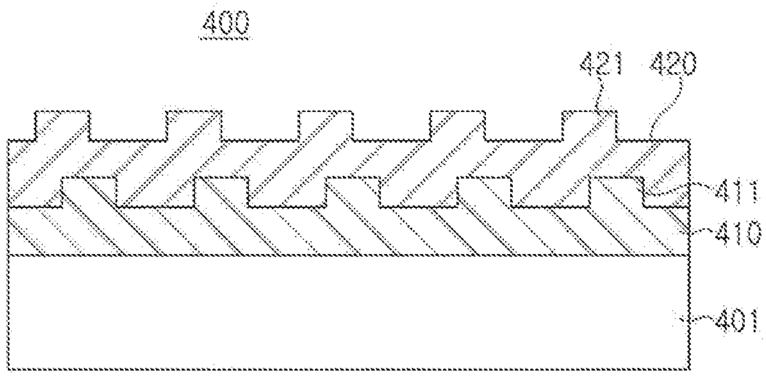
FIG. 10 is a diagram illustrating a semiconductor device according to an example embodiment of the present disclosure.

FIG. 10 is a diagram illustrating a semiconductor device according to an example embodiment.

Referring to FIG. 10, a semiconductor device 400 in an example embodiment may include a wafer 401 including a semiconductor material, and a first layer 410 and a second layer 420 stacked in sequence on the wafer 401. The number of first and second layers 410 and 420 stacked on the wafer 401 may vary depending on the type of semiconductor device 400.

A plurality of first patterns 411 may be formed on the first layer 410, and a plurality of second patterns 421 may be formed on the second layer 420. The plurality of first patterns 411 may be formed by the first semiconductor processing apparatus (e.g., the first optical system of the first photolithography device 11) performing a first photolithography process and subsequent processes for the first layer 410, and the plurality of second patterns 412 may be formed by the second semiconductor processing apparatus (e.g., the second optical system of the second photolithography device 12) performing a second photolithography process and subsequent processes for the second layer 420.

In an example embodiment, after forming a plurality of first patterns 411 on the first layer 410, a material for forming the second layer 420 may be deposited, a second photolithography process may be performed, and correction parameters for correcting the overlay error may be formed. The correction parameters may include a first correction parameter for adjusting the position of the plurality of second patterns 421 based on the plurality of first patterns 411 and a second correction parameter for adjusting the positions of the plurality of second patterns 421 in unit of the second shot area of the second photolithography process. The process apparatus performing the second photolithography process may correct the overlay error based on a correction parameter generated by merging the first correction parameter and the second correction parameter.

Correction parameters for correcting overlay errors of the plurality of first patterns 411 and the plurality of second patterns 421 may be generated in various orders. For example, as illustrated in FIG. 10, when an overlay appears with a constant size in the X-axis direction between the plurality of first patterns 411 and the plurality of second patterns 421, the correction parameter may be generated as a linear correction parameter corresponding to the first order, which will be described in greater detail with reference to FIGS. 11A to 11C.

Figure 11A:
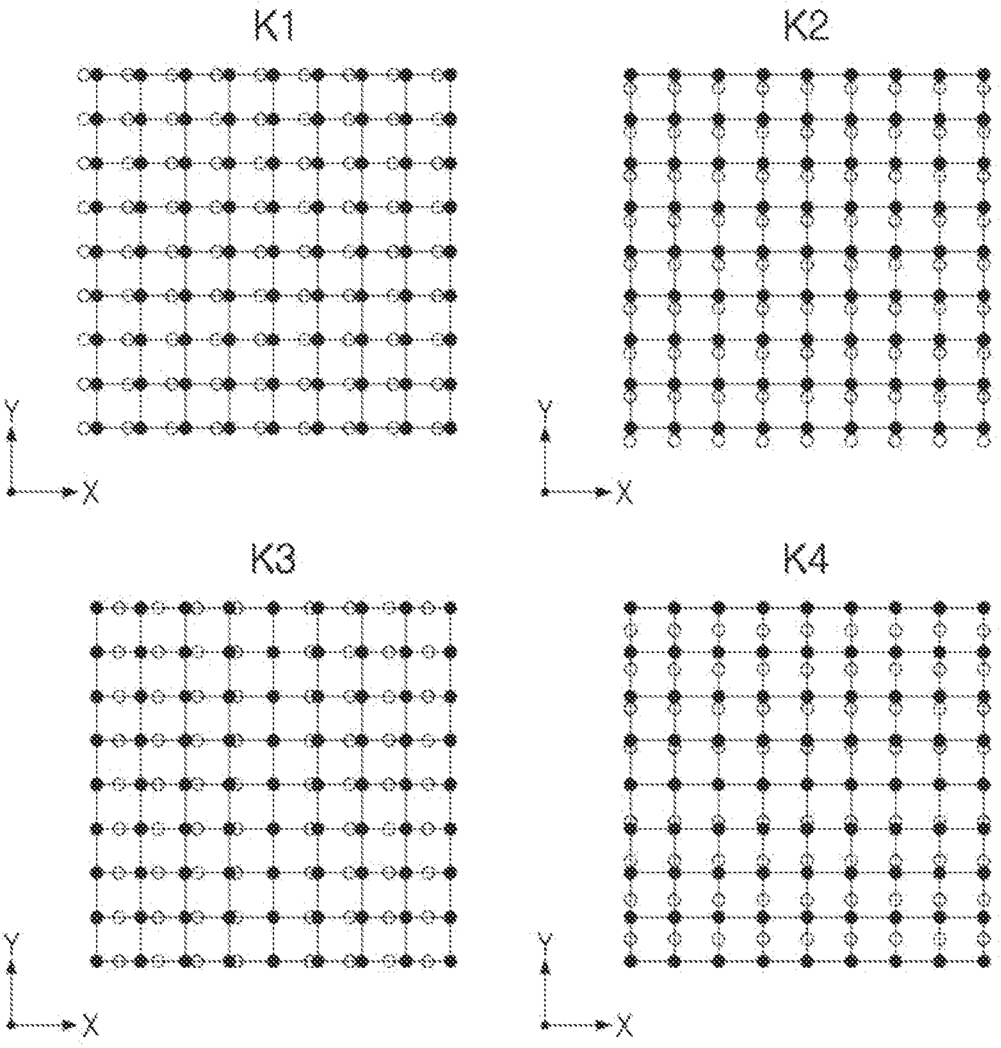
FIGS. 11A to 11C are diagrams illustrating parameters of an overlay error according to an example embodiment of the present disclosure.
Figure 11B:
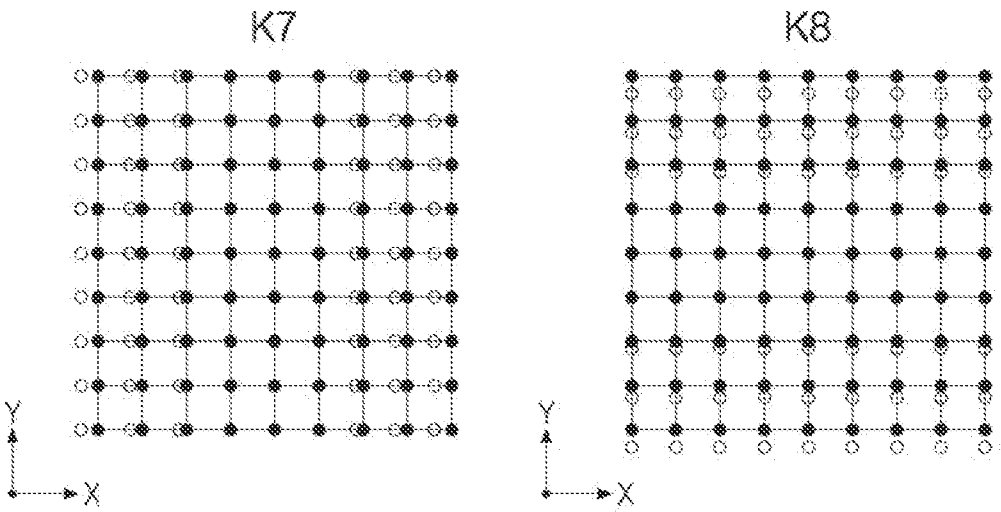
Figure 11C:
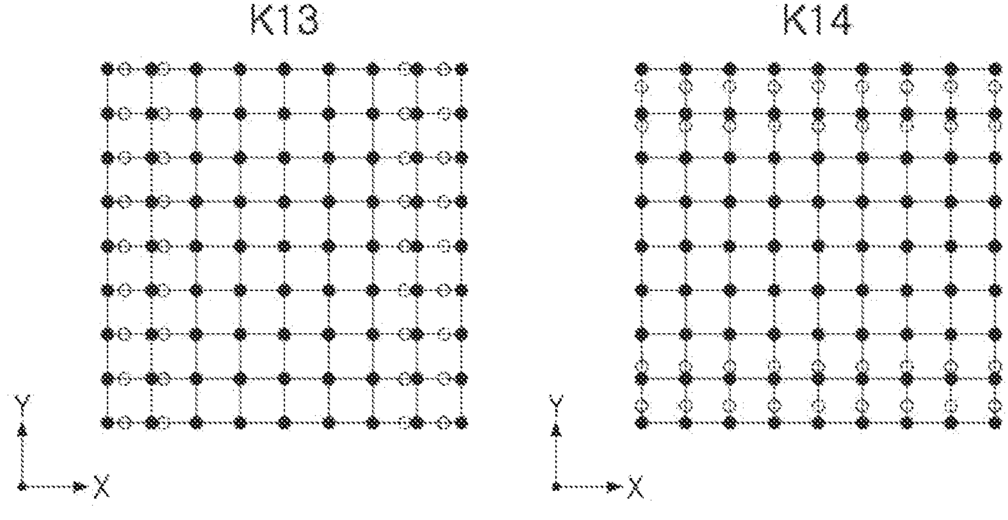

FIGS. 11A to 11C are diagrams illustrating parameters of an overlay error according to an example embodiment.

FIG. 11A may be a diagram illustrating linear correction parameters corresponding to the first order among correction parameters for correcting an overlay error. For example, the K1 correction parameter may correct an overlay error constantly occurring on one side in the X-axis direction, and the K2 correction parameter may correct an overlay error constantly occurring on one side in the Y-axis direction. Accordingly, the K1 correction parameter may be represented in the form of dx=k1, which is a deviation in the X-axis direction, and the K2 correction parameter may be represented in the form of dy=k2, which is a coordinate deviation in the Y-axis direction.

The K3 correction parameter may be for an overlay error proportional to the coordinates on both sides in the X-axis direction, and the K4 correction parameter may be for an overlay error proportional to the coordinates on both sides in the Y-axis direction. Accordingly, the K3 correction parameter may be represented in the form of dx=k3*x, and the K4 correction parameter may be represented in the form of dy=k4*y. Also, in example embodiments, other linear correction parameters may be further generated in addition to the K1 to K4 correction parameters.

Thereafter, referring to FIG. 11B, among correction parameters for correcting an overlay error, correction parameters corresponding to the second order may be illustrated. For example, the K7 correction parameter may be for an overlay error of a size proportional to the square of the coordinates on both sides in the X-axis direction, and the K8 correction parameter may be for an overlay error of a size proportional to the square of the coordinates on both sides in the Y-axis direction. Accordingly, the K7 correction parameter may be represented in the form $dx=k7*x^2$, and the K8 correction parameter may be represented in the form of $dy=k8*y^2$. However, secondary correction parameters may also be further defined in addition to the K7 correction parameters and the K8 correction parameters.

FIG. 11C may be a diagram illustrating correction parameters corresponding to the third order among correction parameters for correcting an overlay error. In the example embodiment illustrated in FIG. 11C, the K13 correction parameter may be for an overlay error of a side proportional to the cube of the coordinates on both sides in the X-axis direction. The K14 correction parameter may be for correcting an overlay error of a size proportional to the cube of coordinates on both sides in the Y-axis direction.

Similarly, the K13 correction parameter may be defined as $dx=k3*x^3$, and the K14 correction parameter may be defined as $dy=k14*y^3$. Also, in example embodiments, other correction parameters other than the K13 correction parameter and the K14 correction parameter may be further defined as the tertiary correction parameters. For example, the K15 correction parameter proportional to the product of the square of the X-axis coordinate and the Y-axis coordinate in the X-axis direction may be represented as $dx=k15*x^2*y$.

In an example embodiment, a first correction parameter commonly applied to a pair of second shot areas matched thereto based on one first shot area, and a second correction parameter individually applied to each of the second shot areas may include at least one of the first, second, and third correction parameters described above. Also, in example embodiments, correction parameters of 4th order or higher may be included in the first correction parameter and/or the second correction parameter.

Figure 12:
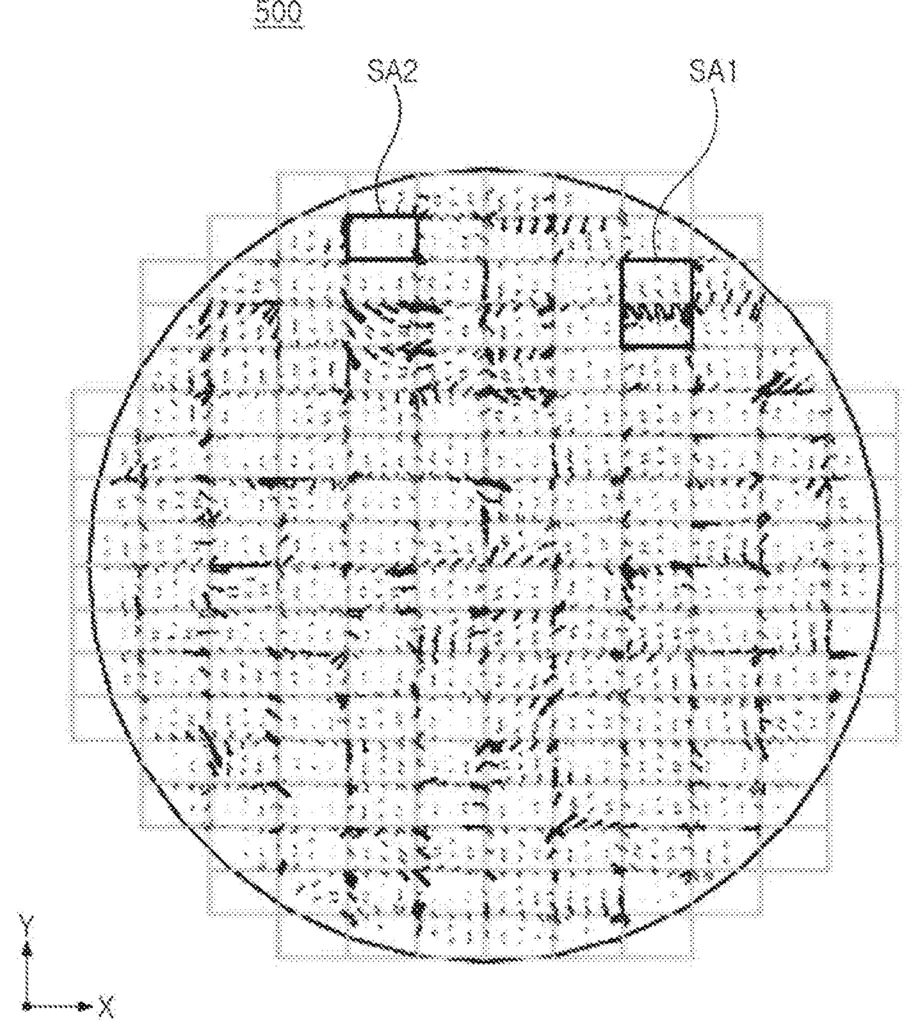
FIG. 12 is a diagram illustrating an overlay error occurring in a semiconductor process according to an example embodiment of the present disclosure.

FIG. 12 is a diagram illustrating an overlay error occurring in a semiconductor process according to an example embodiment.

Referring to FIG. 12, a plurality of first shot areas SA1 and a plurality of second shot areas SA2 may be defined on a wafer 500 in an example embodiment. Each of the plurality of first shot areas SA1 may be irradiated with extreme ultraviolet light in the first semiconductor processing apparatus performing the first photolithography process (e.g., the first optical system of the first photolithography device 11), and each of the plurality of second shot areas SA2 may be irradiated with extreme ultraviolet light in the second semiconductor processing apparatus performing the second photolithography process (e.g., the second optical system of the second photolithography device 12).

In the first photolithography process, extreme ultraviolet light passing through the first optical system of the first numerical aperture may be irradiated to the wafer 500, and in the second photolithography process, the wafer 500 may be irradiated with extreme ultraviolet light passing through a second optical system of a second numerical aperture larger than the first numerical aperture. Accordingly, as illustrated in FIG. 12, the area of each of the plurality of second shot areas SA2 may be smaller than the area of each of the plurality of first shot areas SA1. Also, a pair of second shot areas SA2 adjacent to each other in the first direction (Y-axis direction) may match one of the plurality of first shot areas SA1.

Referring to FIG. 12, an overlay error between a plurality of first shot areas SA1 and a plurality of second shot areas SA2 may be displayed. A plurality of first patterns may be formed on the first layer defining the plurality of first shot areas SA1 by the first photolithography process and subsequent processes thereafter, and a plurality of second shot areas SA2 may be defined on the second layer above the first layer by a second photolithography process. Accordingly, an overlay error may be generated by the first photolithography process, the subsequent process, and the second photolithography process.

In an example embodiment, a first correction parameter for correcting an overlay error generated in a process of forming a plurality of first patterns on a first layer, and a second correction parameter for correcting an overlay error generated in a second photolithography process performed on a second layer may be individually generated. Since the process of forming the plurality of first patterns may further include subsequent processes such as a deposition process and an etching process in addition to the first photolithography process, the overlay error corrected by the first correction parameter may be greater than an overlay error corrected by the second correction parameter.

FIGS. 13 to 16 are diagram illustrating a method of controlling a semiconductor process according to an example embodiment.

Figure 13:
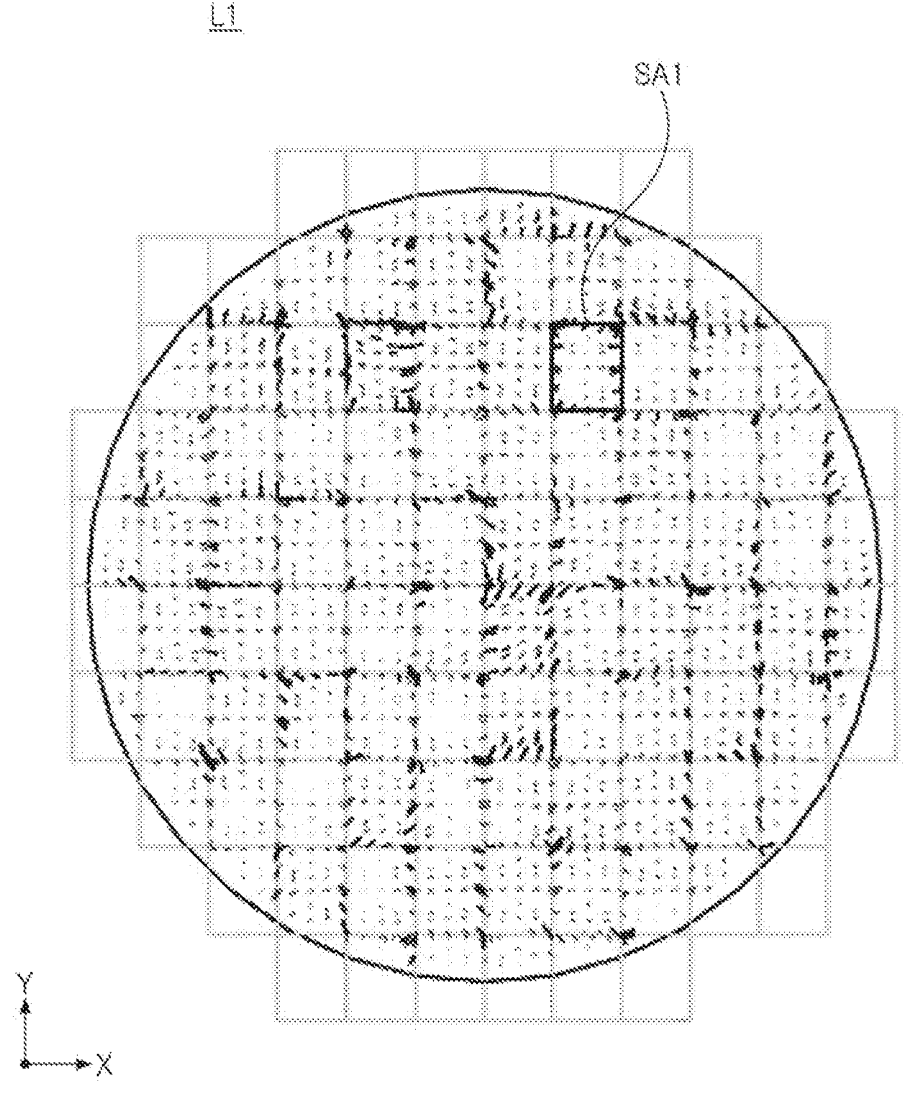
FIGS. 13 to 16 are diagrams illustrating a method of controlling a semiconductor process according to an example embodiment of the present disclosure.
Figure 14:
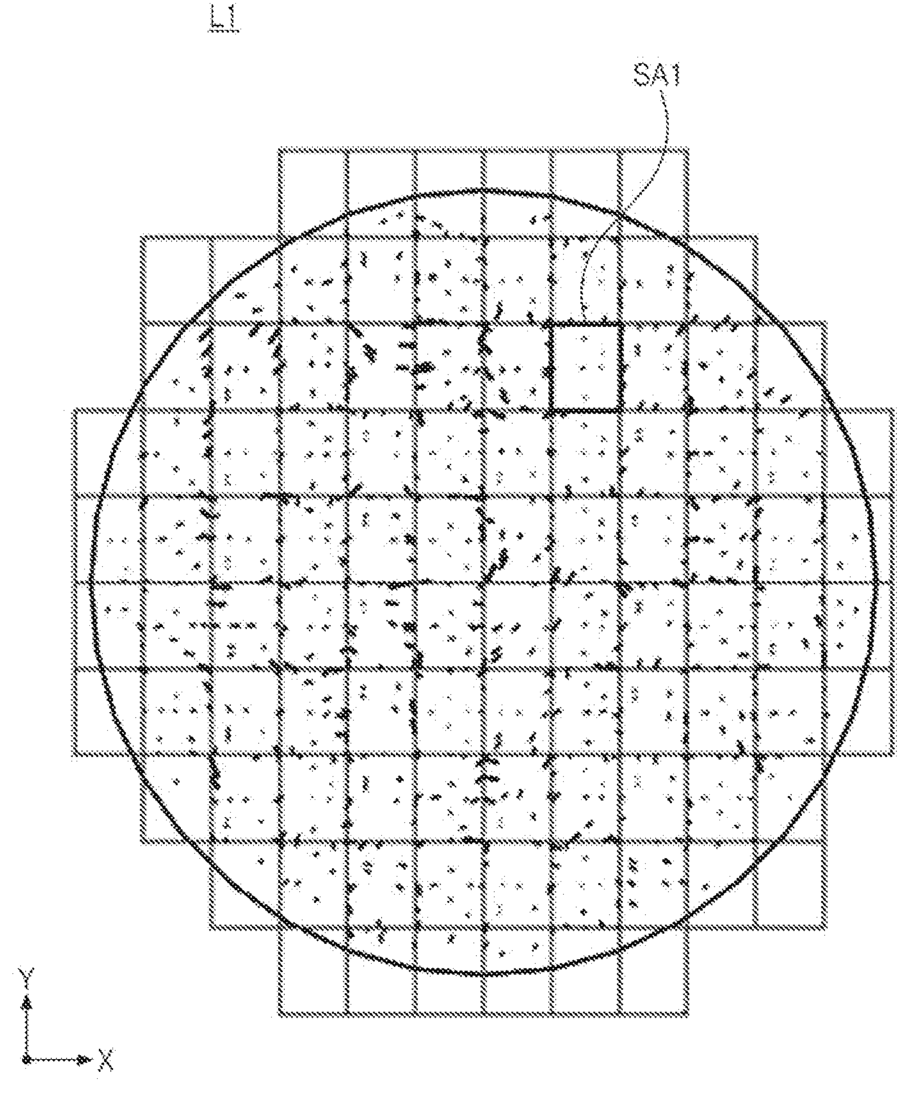

FIG. 13 is a diagram illustrating an overlay error generated in a process of forming a plurality of first patterns on the first layer L1, and FIG. 14 may be a diagram illustrating a first correction parameter for correcting the overlay error illustrated in FIG. 13. The process of forming the plurality of first patterns may include a first photolithography process of irradiating extreme ultraviolet light to each of the plurality of first shot areas SA1 on the first layer L1 as a unit. As described with reference to FIGS. 11A to 11C, the first correction parameters may include second or higher order correction parameters in addition to the first order linear correction parameters.

However, the first correction parameter for correcting the overlay error illustrated in FIG. 13 may be applied to the second photolithography process performed on a second layer above the first layer L1, rather than the process of forming a plurality of first patterns on the first layer L1. The overlay error occurring in the process of forming the plurality of first patterns may affect the alignment state of a plurality of first patterns formed on the first layer L1 and a plurality of second patterns formed on a second layer above the first layer L1. Accordingly, by controlling the second photolithography process performed on the second layer above the first layer L1 with reference to the first correction parameter generated as illustrated in FIG. 14, an overlay error between the first layer L1 and the second layer above the first layer L1 may be reduced based on the first layer L1.

Figure 15:
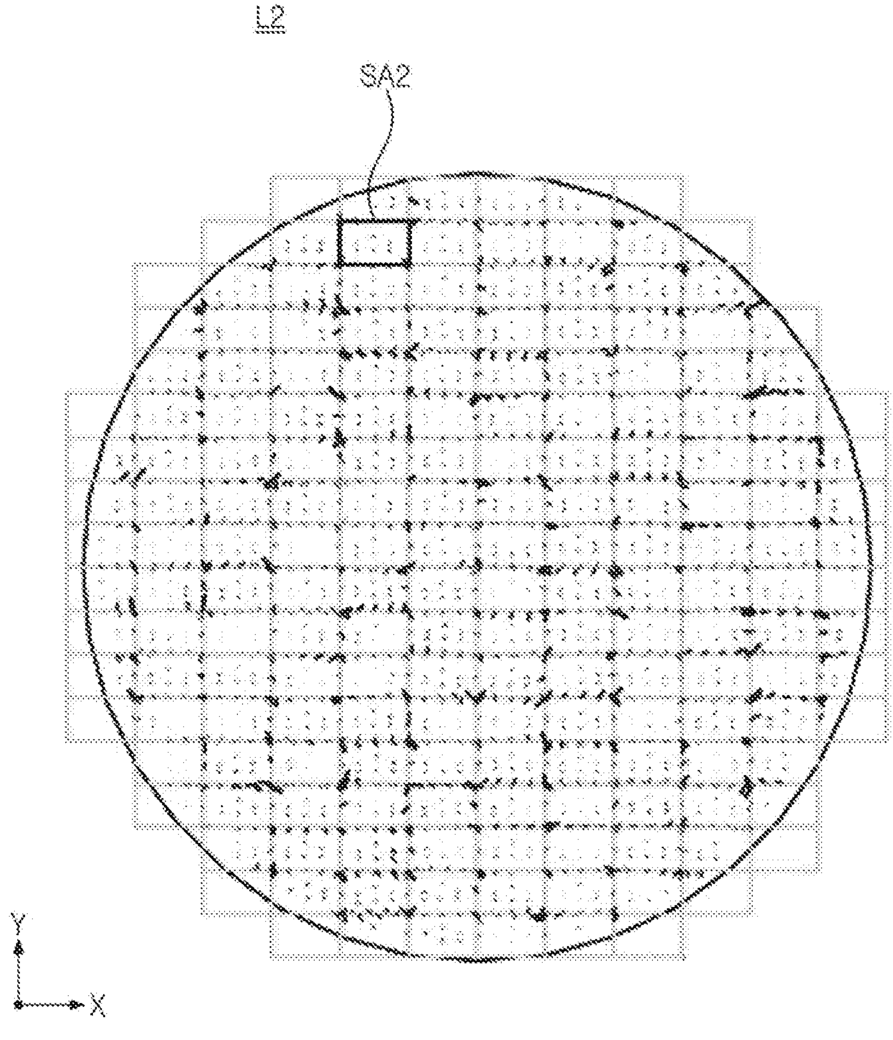
Figure 16:
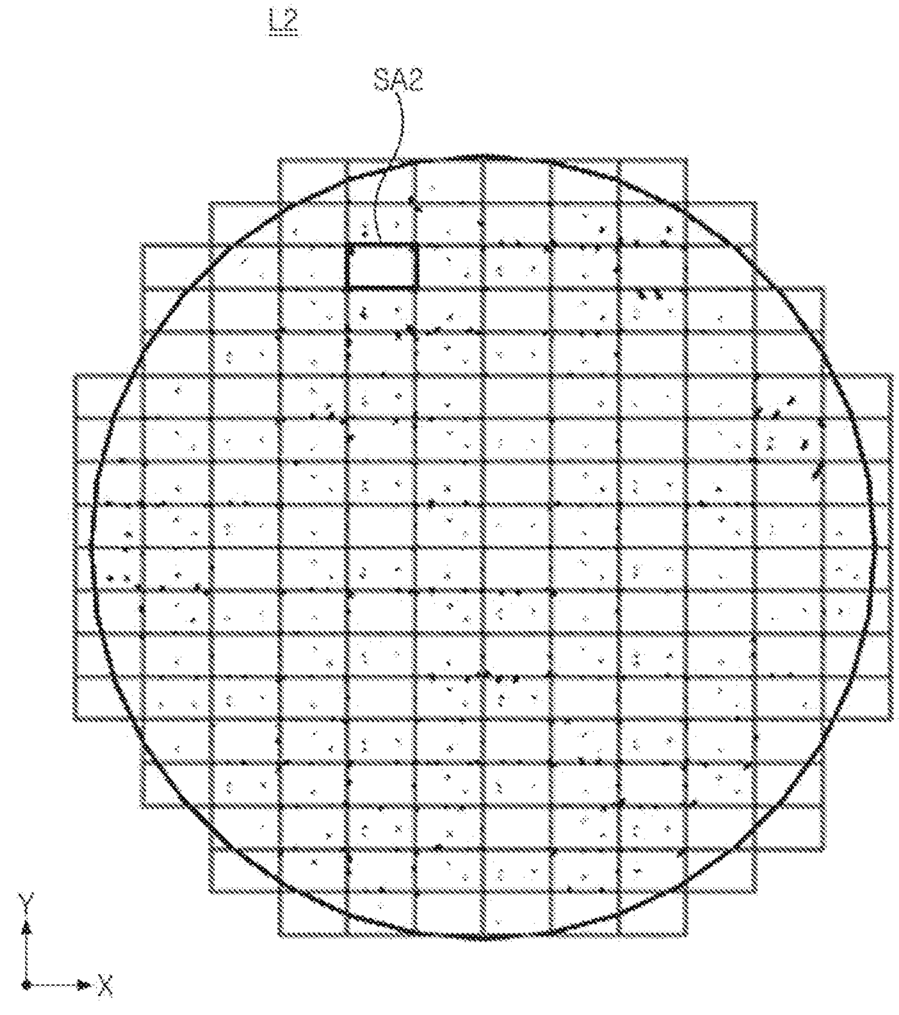

FIG. 15 is a diagram illustrating an overlay error generated in a process of forming a plurality of second patterns in the second layer L2 on the first layer L1, and FIG. 16 may be a diagram illustrating second correction parameters for correcting the overlay error illustrated in FIG. 15. The process of forming the plurality of second patterns may include a second photolithography process of irradiating extreme ultraviolet light to the second layer L2 in each of the plurality of second shot areas SA2 as a unit. Similar to the first correction parameter, the second correction parameter may also include second order or higher correction parameters in addition to the first order linear correction parameter.

Referring to FIG. 15, an overlay error generated in the second photolithography process may be smaller than an overlay error generated in the process of forming a plurality of first patterns, as illustrated in FIG. 13. This is because, in addition to the first photolithography process of irradiating extreme ultraviolet light to the plurality of first shot areas SA1, the process of forming the plurality of first patterns may further include at least one subsequent process of generating an overlay error.

The area of each of the plurality of second shot areas SA2 may be smaller than the area of each of the plurality of first shot areas SA1, for example, the half of the area of each of the plurality of first shot areas SA1. This is because the numerical aperture of the optical system through which extreme ultraviolet light passes in the second photolithography device performing the second photolithography process may be greater than the numerical aperture of the optical system through which extreme ultraviolet light passes in the second photolithography device performing the first photolithography process.

Referring to FIGS. 13 to 16, one of the plurality of first shot areas SA1 may overlap a pair of second shot areas SA2 adjacent to each other in the first direction (Y-axis direction). When the plurality of second shot areas SA2 are formed, the second photolithography apparatus may generate a first correction parameter for correcting a first overlay error of a pair of second shot areas SA2 matched to each of the plurality of first shot areas SA1 based on each of the plurality of first shot areas SA1. Here, the first overlay error may be an error occurring in a process of forming a plurality of first patterns on the first layer L1 as described with reference to FIG. 13. Accordingly, the first correction parameter may be generated as illustrated in FIG. 14.

Thereafter, the second photolithography apparatus may generate a second correction parameter for correcting the second overlay error of each of the plurality of second shot areas SA2. As described with reference to FIG. 15, the second overlay error may be an error occurring during the execution of the second photolithography process and may appear smaller than the first overlay error. The second correction parameter may be generated as illustrated in FIG. 16.

The second photolithography apparatus may apply a first correction parameter and a second correction parameter to an operation of radiating extreme ultraviolet light to form each of the plurality of second shot areas SA2, thereby adjusting the position of at least one of the mask stage and the wafer stage. Since a first correction parameter may be commonly applied to a pair of second shot areas SA2 matched to one of the plurality of first shot areas SA1, and the second correction parameter may be individually applied to each of the plurality of second shot areas SA2, in the process of forming at least a portion of the plurality of second shot areas SA2, positions and postures of the mask stage and the wafer stage may be controlled differently. Accordingly, the plurality of second shot areas SA2 may be aligned and formed based on the plurality of first shot areas SA1 having already been formed, and by reducing the overlay error, the yield of the semiconductor process may be improved.

According to the aforementioned example embodiments, a pair of second shot areas among a plurality of second shot areas to which extreme ultraviolet light is irradiated through an optical system of a second numerical aperture may be matched to each of the plurality of first shot areas to which extreme ultraviolet light is irradiated through the optical system of the first numerical aperture. An overlay error may be accurately corrected using a first correction parameter commonly applied to a pair of second shot areas matched to one of the plurality of first shot areas, and a second correction parameter individually applied to each of the pair of second shot areas, and a defect rate in a semiconductor process may be reduced.

While the example embodiments have been illustrated and described above, it will be apparent to those skilled in the art that modifications and variations could be made without departing from the scope of the present disclosure as defined by the appended claims.

What is claimed is:

1. A method of correcting overlay, the method comprising:

forming a plurality of first patterns in a plurality of first shot areas by radiating extreme ultraviolet light reflected from a first mask to a first layer through a first optical system;

forming a plurality of second patterns in each of a plurality of second shot areas by radiating extreme ultraviolet light reflected from a second mask to a second layer above the first layer through a second optical system different from the first optical system;

matching a pair of second shot areas among the plurality of second shot areas to each of the plurality of first shot areas; and generating a first correction parameter and a second correction parameter for correcting an overlay error of the plurality of second patterns in each of the plurality of second shot areas, wherein the first correction parameter includes parameters to correct an overlay error of each of the plurality of second shot areas based on the first shot area matched to each of the plurality of second shot areas, and the second correction parameter includes parameters to correct an overlay error between the pair of second shot areas matched to each of the plurality of first shot areas.

2. The method of claim 1, wherein a first light irradiation area included in the first mask and corresponding to one first shot area of the plurality of first shot areas has a length N times a length of the one first shot area in each of first and second directions parallel to an upper surface of a wafer and intersecting each other, wherein a second light irradiation area included in the second mask and corresponding to one second shot area of the plurality of second shot areas has a length M times a length of the second shot area in the first direction, and has a length N times a length of the one second shot area in the second direction, and wherein M is greater than N.

3. The method of claim 2, wherein N is 4 and M is 8.

4. The method of claim 1, wherein a numerical aperture of the first optical system is smaller than a numerical aperture of the second optical system.

5. The method of claim 1, further comprising:

controlling a photolithography process for forming the plurality of second patterns using the first correction parameter and the second correction parameter.

6. The method of claim 1, wherein the pair of second shot areas are arranged in a first direction parallel to an upper surface of a wafer.

7. The method of claim 6, wherein the first correction parameter applied to one of the pair of second shot areas is the same as the first correction parameter applied to another one of the pair of the second shot areas.

8. The method of claim 7, wherein the second correction parameter applied to the one of the pair of second shot areas is different from the second correction parameter applied to the another one of the pair of second shot areas.

9. The method of claim 7, wherein a deviation of the first correction parameter is greater than a deviation of the second correction parameter.

10. The method of claim 1, wherein a plurality of first overlay keys are disposed in each of the plurality of first shot areas, and a plurality of second overlay keys are disposed in each of the plurality of second shot areas, and wherein the first correction parameter and the second correction parameter are generated using coordinate values of the plurality of first overlay keys and the plurality of second overlay keys.

11. The method of claim 10, wherein the first correction parameter is generated by converting the coordinate values of the plurality of second overlay keys disposed in each of the pair of second shot areas into correction coordinate values corresponding to a coordinate system of the first shot area matched to the pair of second shot areas.

12. The method of claim 1, wherein after the overlay error of each of the plurality of second shot areas is corrected using the first correction parameter, the overlay error between the pair of second shot areas is corrected using the second correction parameter.

13. A method of controlling a semiconductor process, the method comprising:

forming a first layer and a second layer sequentially stacked on at least a partial region of a wafer;

generating correction parameters for correcting an overlay error of a plurality of second patterns included in the second layer based on a plurality of first patterns included in the first layer; and controlling a photolithography process for forming the plurality of second patterns based on the correction parameters, wherein the plurality of first patterns are formed by a first photolithography process performed on a plurality of first areas included in the first layer, and the plurality of second patterns are formed by a second photolithography process performed on a plurality of second areas included in the second layer, wherein two or more second areas adjacent to each other of the plurality of second areas are disposed on each of the plurality of first areas, and wherein the second photolithography process is controlled based on a first correction parameter commonly applied to the two or more second areas and a second correction parameter individually applied to the two or more second areas.

14. The method of claim 13, wherein each of the plurality of first areas is a unit area to which light is irradiated at once in the first photolithography process, and each of the plurality of second areas is a unit area to which light is irradiated at once in the second photolithography process.

15. The method of claim 13, wherein an area of each of the plurality of first areas is larger than an area of each of the plurality of second areas.

16. The method of claim 15, wherein the area of each of the plurality of first areas is twice the area of each of the plurality of second areas.

17. A semiconductor processing apparatus, comprising:

a light source configured to output extreme ultraviolet light;

an optical system configured to reflect the extreme ultraviolet light output by the light source from a mask and to allow light to be incident to a wafer on which a first layer and a second layer are sequentially stacked;

a control unit configured to control the light source and the optical system; and a measurement unit configured to measure overlay errors of the first layer and the second layer, wherein the first layer includes a plurality of first patterns formed in each of a plurality of first shot areas, and the control unit allows extreme ultraviolet light to be incident to each of a plurality of second shot areas of the second layer and forms a plurality of second patterns, and wherein the measurement unit matches a pair of second shot areas among the plurality of second shot areas to each of the plurality of first shot areas, and generates a first correction parameter for correcting an overlay error of the pair of second shot areas based on the plurality of first shot areas, and a second correction parameter for correcting an overlay error between the pair of second shot areas.

18. The semiconductor processing apparatus of claim 17, wherein the pair of second shot areas are arranged in a first direction parallel to an upper surface of the wafer.

19. The semiconductor processing apparatus of claim 17, wherein each of the plurality of first shot areas is an area to which extreme ultraviolet light passing through a first optical system having a first numerical aperture is incident, and wherein the optical system is a second optical system having a second numerical aperture greater than the first numerical aperture.

20. The semiconductor processing apparatus of claim 17, further comprising:

a mask stage on which the mask is seated; and a wafer stage on which the wafer is seated, wherein the control unit controls at least one of the mask stage and the wafer stage based on the first correction parameter and the second correction parameter.

* * * * *